United States Patent [19]

Vilard

[11] Patent Number: 4,924,300

[45] Date of Patent: May 8, 1990

[54] METHOD OF AND DEVICE FOR TUNING A RESONANT CIRCUIT COUPLED TO A FREQUENCY DISCRIMINATOR

[75] Inventor: Philippe Vilard, Rueil, France

[73] Assignee: U. S. Philips Corporation, New York, N.Y.

[21] Appl. No.: 241,515

[22] Filed: Sep. 7, 1988

[30] Foreign Application Priority Data

Sep. 22, 1987 [FR] France ............................ 87 13061

[51] Int. Cl.⁵ ............................................. H04N 5/44
[52] U.S. Cl. .................................. 358/23; 358/191.1; 455/186
[58] Field of Search ....................... 358/10, 11, 14, 18, 358/23, 24, 35; 329/50, 103, 1; 455/214, 67, 337, 186

[56] References Cited

U.S. PATENT DOCUMENTS

| | | | |
|---|---|---|---|
| 4,287,530 | 9/1981 | Gay et al. | 358/23 |
| 4,338,580 | 7/1982 | Gay | 358/23 X |
| 4,359,694 | 11/1982 | Suenaga | 358/23 X |
| 4,438,451 | 3/1984 | Hinn et al. | 358/25 X |
| 4,511,923 | 4/1985 | Götz | 358/191.1 |
| 4,603,302 | 7/1986 | Lawton | 455/214 |
| 4,685,150 | 8/1987 | Maier | 455/186 X |
| 4,760,535 | 7/1988 | Englmeier | 455/186 X |

*Primary Examiner*—James J. Groody
*Assistant Examiner*—Mark R. Powell
*Attorney, Agent, or Firm*—Edward W. Goodman

[57] ABSTRACT

Automatic adjusting device: an oscillator followed by an inverter feeds the resonant circuit, which is followed by a frequency discriminator. The circuit is, for example, the "cloche" circuit of a SECAM decoder unit. The discriminator then forms part of the television set. A synchronizing source applies line and field synchronizing signals and a color identification signal to a synchronizing signal and window generator. The latter applies to the inverter a signal which triggers the inversion of the signal coming from the oscillator, which produces a 180° phase jump. It also applies to a measuring and processing circuit a time window which is used during the measurement at the output of the discriminator of the transient signal produced by the phase jump. The result of the measuring operation is applied to an element which acts on the adjustment of the resonant circuit.

21 Claims, 2 Drawing Sheets

METHOD OF AND DEVICE FOR TUNING A RESONANT CIRCUIT COUPLED TO A FREQUENCY DISCRIMINATOR

BACKGROUND OF THE INVENTION

The invention relates to a method of and a device for tuning a resonant circuit. This method and this device can be used in television, and more specifically to adjust the tuning of the "cloche" circuit of a television receiver of the SECAM type.

To adjust such a circuit during the manufacture of the television set, several methods can be used.

It is, for example, possible to use a system which measures the current entering the resonant circuit and the voltage at its terminals, and the adjustment is correct when these two values are in phase at the nominal frequency. The phase is compared on the screen of an oscilloscope and the adjustment is effected manually. Using an automatic adjustment would be difficult as the very accurate phase difference measurement is not simple.

It is alternatively possible to use, to determine the adjustment to be performed so as to tune the resonant circuit, a signal which is produced by a frequency discriminator coupled to an output of the resonant circuit, and to excite the resonant circuit repeatedly and sequentially in two different modes. A method of this type is disclosed in the document DE-A 2,702,565, which teaches the observation on the screen of an oscilloscope of the signal supplied by the discriminator while the resonant circuit is sequentially excited by frequencies located symmetrically with respect to the nominal frequency of the "cloche" circuit, with the object of manually adjusting the resonant circuit.

SUMMARY OF THE INVENTION

The invention has for its object to provide a method which is much more accurate and easier to automate and which, consequently, renders it possible to provide a device mounted in any type of television set and which is capable of automatically ensuring the adjustment of the "cloche" circuit within the television set itself. Such a device is especially advantageous when the "cloche" circuit is an integrated circuit of the switched-capacitor type.

The method according to the invention is therefore characterized in that the amplitude of a transient signal produced by the discriminator immediately after the change from the first to the second mode of exciting the circuit is used to determine the adjustment, at each repetition the circuit being first excited by a signal whose frequency is the nominal tuning frequency.

Thus, this method requires only the supply of one single frequency, and an amplitude which is easy to be measured is used as the decisive value for the adjustment.

In a simple variant, the repetitive signal is suddenly suppressed at a predetermined instant during each repetition.

In accordance with a further variant, an improved sensitivity is obtained when the phase of the repetitive signal is suddenly inverted by 180°, at least once during each repetition.

Moreover, it is possible to eliminate the influence of any maladjustment of the frequency discriminator, by sampling this discriminator-produced signal at two instants, one of which corresponds to a rate fixed by the excitation at the nominal frequency and the other follows immediately after the change from the first to the second mode, and by using the difference between the two samples to determine the adjustment.

A device according to the invention, for example the decoder stage of a television set of the SECAM type, provided with an adjustable resonant circuit and at least one frequency discriminator coupled to an output of the resonant circuit, is characterized in that it comprises:

a generator producing a signal at the desired nominal frequency for the resonant circuit and at a first instant causes a sudden modification there, synchronizing means determining said first instant, as well as a second instant following rapidly after the first instant, means for replacing, during a period of time comprising said first instant, a signal applied to the resonant circuit (which in the case of a SCAM stage is the "cloche" circuit) by the signal produced by the generator, means for sampling at the second instant the signal supplied by the discriminator, and for shaping it so as to supply an error signal which is a function of the amplitude of the sampled signal, and means for adjusting the resonant circuit as a function of the error signal.

Preferably, the synchronizing action indicates this first instant once during each field retrace.

The device according to the invention renders it possible to economize the control stage of the resonant circuit during the manufacture of the television set, and moreover it ensures that the control of this circuit will remain perfect during the whole life of the set.

Advantageously, the generator is constituted by an oscillator being frequency-controlled by a feedback loop which is based on the line frequency, by means of which a perfect stability can be obtained in an economic manner.

The means for adjusting the resonant circuit advantageously comprise means for controlling the switching of capacitors, said controlling means being constituted by a memory whose content is either incremented or decremented at each sampling action according to the sign of the signal supplied by the discriminator, or is kept as it is when the absolute value of this signal is below a predetermined value, and, the content of the memory being expressed in binary notation, each of its bits controlling the switching of one of the capacitors.

The following description which is given by way of nonlimitative example with reference to the accompanying drawings will make it better understood how the invention can be put into effect.

Figure 2:
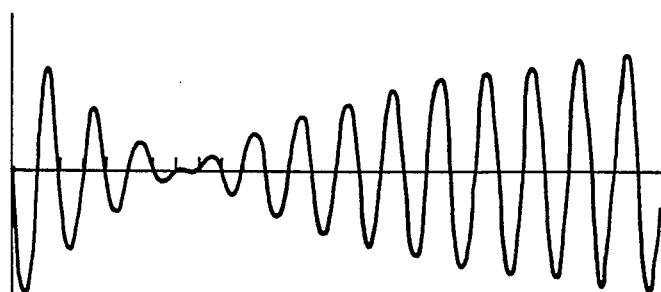
Figure 3:
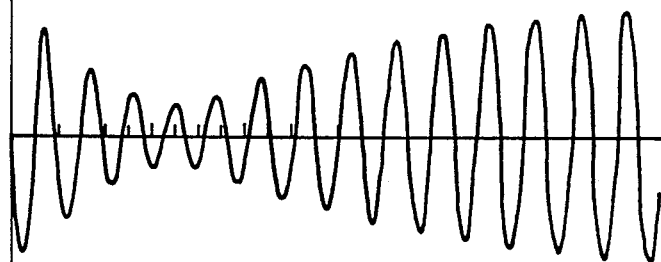
Figure 4:

The FIGS. 2, 3, 4 are diagrams showing the development versus time of the various signals which occur in the device.

Figure 5:
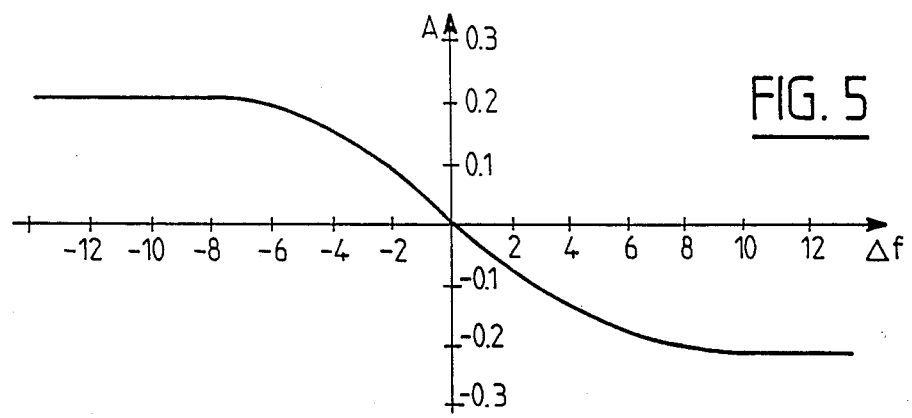

FIG. 5 is a diagram illustrating the sensitivity of the method.

Figure 6:
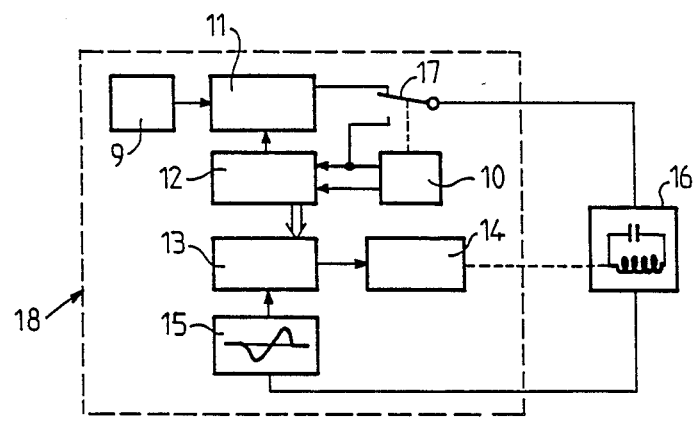

FIG. 6 shows a device for putting the method according to the invention into operation, during an adjustment in the course of manufacture.

Figure 7:
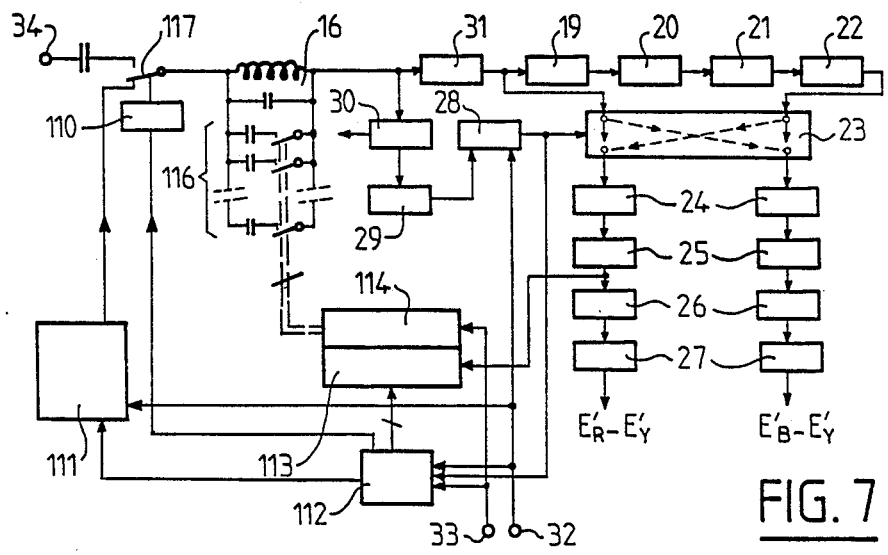

FIG. 7 shows a SECAM decoding stage comprising means in accordance with the invention.

DETAILED DESCRIPTION OF THE INVENTION

Figure 1:
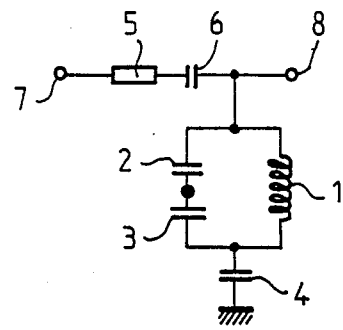
FIG. 1 shows, as an example of the resonant circuit, the "cloche" circuit of a SECAM television set.

The "cloche" circuit of FIG. 1 is nowadays used in the manufacture of television sets. It comprises a proper resonant circuit constituted by the inductance 1 arranged in parallel with the tuning capacitors 2, 3. There are two capacitors 2, 3 so as to constitute a capacitive divider by means of which the voltage can be measured without the risk that the capacitance of the measuring probe will derange the circuit. A resistor 5 and an insulation capacitor 6 are arranged between the input 7 and the circuit. The output signal is present at the terminal 8, which is connected to the resonant circuit. The capacitor 4 is only used to provide electrical insulation.

The invention renders it furthermore possible to save the capacitor 3 when there is no need to measure the voltage at the level of the circuit itself.

The principle on which the method of the invention is based, is the sudden modification of the mode of exciting the circuit so that, during the change from the first to the second mode, the circuit passes through a transition phase of a "free path" in which its actual characteristic show during a brief instant: when the detuned circuit (that is to say its actual frequency differs from the nominal frequency) is excited at the nominal frequency, and there is a discontinuity in the mode in which it is excited, the oscillation frequency before the discontinuity is obviously the nominal frequency, and this is also the case a certain period of time after the discontinuity, but between the two instants the circuit reacts in a specific manner which depends on its natural frequency and its over-voltage.

The FIGS. 2 and 3 illustrate this phenomenon. They show the result of a computer simulation of a resonant circuit whose over-voltage has the value sixteen, as that of a "cloche" circuit. At the base of the abscissae, the phase of the excitation voltage is suddenly shifted through 180°, that is to say the signal is inverted. As regards FIG. 2, the excitation is effected at the tuning frequency and, as regards FIG. 3, the excitation action is effected at 0.99 times the natural frequency of the circuit.

In the first case (FIG. 2), during the phase of the "free path", the amplitude decreases, is cancelled, increases thereafter again to reach its initial level. Since the initial frequency was the natural resonant frequency of the circuit, it has no reason whatsoever to vary and the zero-crossings of the wave are effected regularly at the same instants as when nothing had changed in the mode of excitation the circuit.

In the second case (FIG. 3) the amplitude decreases but is not cancelled. The frequency tends to shift in a direction which depends on the sign of the difference between the excitation frequency and the natural frequency, that is to say here it tends to increase, and the zero-crossings are effected earlier than in the previous case. Ultimately, one half-period has been "lost" and the signal is again in phase with the new excitation voltage, whose frequency is still 0.99 times the actual frequency).

Since the frequency varies and furthermore the amplitude is not equal to zero, a frequency discriminator which is coupled to an output of the "cloche" circuit then produces a signal which is shown in FIG. 4. In the case of FIG. 2, it being assumed that this discriminator is controlled symmetrically with respect to the nominal frequency, it does not produce any signal.

Obviously, when the starting frequency is higher than the frequency of the circuit, the transitory drift takes place in the other direction, and the signal produced by the discriminator is of the opposite sign: this signal then renders it possible to determine in which direction action must be taken to obtain tuning of the circuit.

FIG. 5 illustrates the sensitivity obtained by means of the above-described method. The amplitude (in Volts) of the pulse of FIG. 4 is plotted on the ordinate, the frequency detuning is shown at the abscissa in kHz. This curve has been obtained by step-wise modifying the frequency of the excitation signal and by each time measuring the peak voltage of the pulse. It can be seen that the maximum amplitude has already substantially been reached at a frequency deviation of 6 to 8 kHz, while the customary adjusting tolerance of a "cloche" circuit is approximately 40 kHz. Consequently, the method provides an exceptionally advantageous sensitivity: it has been measured that for a maladjustment $\Delta f = 5$ kHz, a frequency variation is obtained which transiently supplies the same amplitude at the output of the discriminator as a permanent deviation of 400 kHz. The increase in sensitivity is 80/1.

The change in the excitation action is repetitive, so as to facilitate measuring of the effect produced. In a checking and/or adjusting apparatus for a "cloche" circuit, a 4.286 MHz wave is fed into the "cloche" circuit, this wave evidencing a phase jump of 180°, once during each scanning line of television picture. In certain television set models, the signal supplied by the discriminator has a different D.C. level in one line out of two, and in addition has an opposite sign. It is therefore necessary to measure the produced effect in only one of two lines. It should be noted, although this cannot be of any use in mechanizing the adjustment, that the visual effect produced on the screen of the television set is interesting and can be used for a manual adjustment. If the tuning is perfect, the screen is of a uniform magenta shade. In the event of detuning, a vertical bar corresponding to the phase jump appears, which is blue or red according to the direction of the tuning. This procedure is extremely sensitive, for such a bar appears well before the maladjustment exceeds the existing standards. So as to produce a test pattern suitable for adjustment within a predefined tolerance (for example 4.286 MHz±40 kHz), one can transmit the two limit frequencies (here 4.246 and 4.326 MHz) multiplexed over a few lines, with a phase break at a line instant which differs for each of these frequencies. If the circuit is within the tolerances, then two bars of different colors are displayed on the screen, and when the circuit is outside the tolerances, two bands of the same color (red or blue according to the direction of maladjustment) are shown.

Instead of inverting the signal, it is alternatively possible to suppress it suddenly: during the damped decreasing phase of the signal in the circuit, the frequency slides towards its nominal value, before the signal is cancelled. It is alternatively possible to suppress it only during a time window to re-establish it thereafter, with its initial phase, which produces two consecutive opposite frequency slides. Anyway, the method using a 180° phase jump provides a very high sensitivity with a much greater ease of exploitation of the signal supplied by the discriminator.

In the automatic adjusting device of a resonant circuit shown in FIG. 6, an oscillator 9 followed by an inverter 11 feeds the resonant circuit 16, followed by the frequency discriminator 15. When the circuit 16 is the "cloche" circuit in a SECAM decoder unit, the discriminator 15 is already part of the television set. The synchronizing source 10 applies line and field signals and a color identification signal to a synchronizing signal and window generator 12. The latter applies the signal to the inverter, which causes the 180° phase jump. It also applies to a measuring and processing circuit 13, two time windows which are used to measure the transient signal. The result of the measuring circuit 13 is applied to an element 14. For an adjusting device which is used in a workshop, this element is a drive chain which mechanically activates the adjustment of the resonant circuit 16. For an adjusting device incorporated in a television set having a "cloche" circuit comprising a network of switched capacitors which are switched by integrated interruptors, the element 14 is an electronic logic arrangement which controls the opening or closing of the electronic interruptors, thus making given capacitors of the filter inoperative or operative.

The elements of this device can be easily realized by a person skilled in the art, to satisfy for an adjusting device used in a workshop, the following functions:

oscillator 9: this oscillator is, for example, realized by means of a quartz oscillator, which preferably has a frequency which is twice the nominal frequency, i.e. 8.572 MHz.

inverter 11: this is, for example, a bistable trigger circuit which divides the 8.572 MHz signal by two, which produces two opposite signals at two outputs. Each of these outputs is connected to the "cloche" circuit via a gate and only one of these two gates is open each time. The signal produced by the synchronizing signal and window generator 12 causes the gate to change state. It is alternatively possible to effect that, when the bistable trigger circuit which divides the oscillator signal by 2 receives the signal from the peak generator 12, it is inhibited during one period and consequently introduces a 180° phase jump in the outgoing signal. This last-mentioned signal is a square-wave signal, which is not of any importance, since the harmonics are filtered by the resonant circuit. A changeover switch 17, which has for its object to supply the signal only during the forward phases of the line scan, is provided at the output. During the retraces the synchronizing signals and the customary identification bursts are supplied from:

the synchronizing source 10 which can optionally be derived from an existing test pattern generator.

window generator 12: this generator produces different signals on the basis of the line synchronizing signals. It applies a synchronizing signal, for example approximately 15 μs after the beginning of a line, to the inverter 11. It applies to the measuring circuit 13 a measuring window which starts approximately 1 μs after said synchrozining signal and has a duration of approximately 3 μs, and a second window of the same duration, which is, for example, located 10 to 20 μs after the first window. These windows are only produced in one line out of two, during a predetermined line type (red or blue), the choice being controlled by a color identification signal produced by the generator 10. The latter furthermore applies the control window of the change-over switch 17 to the output of the inverter. Circuits producing such signals more specifically on the basis of successively dividing a clock signal and line synchronizing signals are easy to realize.

measuring circuit 13: the transient signal produced by the discriminator 15 can have a variable polarity and a variable amplitude in accordance with the adjustment of the discriminator, the characteristics of the circuits, the line type (blue/red). To eliminate these effects, the generator 12 only supplies the measuring windows, as described hereinbefore, during predetermined lines. Moreover, the signal is superposed on a D.C. signal which also depends on the same parameters. To eliminate the effect of the D.C. signal, the two consecutive windows described above with respect to the generator 12, are used. The value supplied by the discriminator is stored (for example in an analog manner, by charging a capacitor in proportion with this value) during each of these two windows (each time in a different capacitor) after which the difference between these two values is detected by means of a differential assembly and applied to the element 14 which controls the adjustment.

The case of the SECAM decoder unit shown in FIG. 7, provided with a "cloche" circuit 16 comprising switched capacitors, is particularly interesting because of the fact that it includes already a discriminator, and that the television set of which it forms part includes already a synchronization source, which will be used in the device. The following elements are used:

The synchronization source of the television set applies to the inputs 32, 33 the line and field synchronizing signals, respectively.

The elements denoted by reference numerals 19 to 31 are the known, customary components of a decoder unit: the composite video signal processed in the ad-hoc portions (not shown) of the television set is conveyed to the terminal 34. Via a capacitor, thereafter the interruptor 117 whose role will be described hereinafter, thereafter the "cloche" circuit 16, it is applied to the limiting amplifier 31, at the output of which it is switched in two directions. One direction leads directly to a path of the permutation means 23. The other direction leads to the other path, via an impedance matching means 19, a delay line 20, a further matching means 21, and a compensating amplifier 22. At each output of the permutation means there is a cascade arrangement of a limiter 24, a frequency discriminator 25, a de-emphasis circuit 26 and an output stage 27. The signal is also applied to the port 30, connected to the identifying circuit 29 which drives the bistable circuit 28 which is triggered by the line synchronization signals at 32, and which controls the permutation means 23. This whole prior art assembly is shown here only to make it understood how the elements 110 to 117 of the invention are connected there. Also circuit arrangements different from those shown are used: they obviously also have a signal input, a discriminator output and synchronization signals and it is therefore easy to adapt the invention in a similar manner.

The field synchronizing signals at 33 are used to trigger an adjusting procedure at each field retrace, during one or several lines. It would also be possible to provide a procedure each time the television set is put into operation, but it is simpler to avoid a special procedure at the start, and moreover the adjustment for each field as preferred for the case in which a drift of the filter would become manifest after the set has been made operative.

The generator 111 is constituted, in a television set having circuits which are at least partly digital, on the basis of an internal clock present in such a television set. A known circuit of the phase-locked loop type produces a frequency which is a multiple of the line frequency $f_L$. A multiple of 274 times results in the frequency 4.28125 MHz, which is only 4.75 kHz less than the desired frequency. Since the customary tolerance is 40 kHz and the sensitivity of the method is very high, this frequency of $274 \times f_L$ will do. If a higher degree of accuracy is desired, it is possible to produce the frequency $1646 \times f_L$, and to divide it thereafter by six (first a division by 3 and thereafter a division by 2 to obtain a cyclic ratio of 1), the error being less than 500 Hz, or to produce $2743 \times f_L$ and to divide it by 5 and thereafter by 2 (error: 62.5 Hz!).

This generator 111 furthermore includes an inverter similar to the inverter 11 described in the foregoing, to insert a phase change during a line. The flipflop of this inverter produces the last frequency division by two.

The synchronizing means 112 produces a control signal which has a duration equal to one line period or a fraction of a line period during the field retrace, and is applied to the change-over switch 110, 117 which has for its function to replace during the duration of the control signal, the signal at 34 by the signal supplied by the generator 111. (The change-over switch is of course an electronic switch.)

The control signal is triggered from the field retrace synchronizing signal. The output of the bistable trigger circuit 28 which controls the permutation means is also applied to the synchronizing means to 112 to allow the synchronizing means choose at each field retrace a line of the same color.

At a first instant comprised in said line period, a synchronizing signal is applied to the generator 111 via the synchronizing means 112, so as to trigger in the generator 111 a sudden modification, more specifically a 180° phase change, by inverting the signal. Finally, the generator 112 applies to the sampling and processing circuit 113, at a second instant following the first instant after approximately 1 μs, a measuring window which has a duration of approximately 3 μs, and at a third instant, occuring, for example, 10 to 20 μs after the second instant, a second window of an identical duration (all this as in the case of the device which is adjusted during manufacture). The second instant rapidly follows the first instant, in such manner as to correspond to the period of the "free path" of the resonant circuit, and the third instant corresponds to a fixed rate, that is to say it arrives either before the two first instants, or sufficiently later after these two first instants to ensure that the resonant circuit is returned to a stable excitation state.

The sampling circuit 113 is connected to the output of a discriminator 26 and performs the same functions as the discriminator 13 of FIG. 6. Anyway, the presence of two storage capacitors of analog values can be disturbing when the embodiment is realized in integrated circuitry. Two analog-to-digital converters will then be used. These converters are very simple to realize: because of the fact that when the desired adjustment precision is obtained, the amplitude of the transient pulse is still comparatively significant, it is sufficient that the two sampled values are roughly compared during the two windows. The converters can then be devices of some bits only. Furthermore, since the duration of the transient pulse is of the order of microseconds, they do not need to be very fast. It is possible to implement them by defining a small number of discrete thresholds and by comparing the signal to each of these thresholds by means of several comparators or one comparator whose reference input is switched alternately to one of these thresholds. At least that one which corresponds to the first time window is followed by a latch circuit to preserve the sampling value up to the instant at which the second time window or the values of two samples are compared.

The "cloche" circuit 16 comprises a given number of switched capacitors 116. It is possible to choose a value which is high enough for the inductance, so as to reduce the value of the capacitors, which then may be integrated, as well as change-over switches. With a total capacitance of approximately 160 pF and an adjusting amplitude of 10%, the assembly 116 of the switched capacitors has a value of approximately 15 pF. They are divided in, for example, four units having the respective values 1, 2, 4, 8 pF, which allows an adjustment with an accuracy of 1 pF, i.e. 0.6% of the total capacitance, which, in frequency, results in an accuracy of 0.3%, or approximately 13 kHz.

The control circuit 114 of the electronic interruptors is constituted by an up/down counter counting to 16, so to four bits. This up/down counter is incremented or decremented by one unit at each field retrace, according to the sign of the voltage obtained by the comparison between the two samples taken from the output of the discriminator. If however this voltage has an absolute value which is less than a predetermined quantity corresponding to the limit value granted for the adjusting precision, for example 13 kHz for said above-described capacitors, the counter is not activated. As long as it is not activated, it behaves as a memory preserving the counting value. Then it is sufficient to control the switched capacitors 116 each by one of the bits from the counter to accomplish a correct adjustment of the frequency of the "cloche" circuit at the end of a few fields. The highest capacitor is of course connected to the most significant bit, and so forth.

All the above elements can be easily realized by a person skilled in the art from basic logic circuits, and can moreover be easily integrated in a monolithic circuit.

The method according to the invention can alternatively be used to adjust any type of filter whose transient behaviour is similar to that of a "cloche" circuit, that is to say generally at least for filters having symmetrical lateral bands. As regards the incorporated device with periodic action, it can also be used for any type of filter, on the condition that the useful signal may periodically be replaced by the special adjusting signal.

What is claimed is:

1. In a device having at least one frequency discriminator with an adjustable resonant circuit coupled to the output thereof, a method for tuning the adjustable resonant circuit comprising the steps:
   exciting said adjustable resonant circuit in a first mode with a first signal having a frequency equal to a nominal tuning frequency of said adjustable resonant circuit;
   exciting said adjustable resonant circuit in a second mode with a second signal which is different from said first signal; and
   determining the adjustment for said adjustable resonant circuit using the amplitude of a signal generated by said frequency discriminator after said adjustable resonant circuit is excited by said second signal, wherein said adjustable resonant circuit is repeatedly and sequentially excited in said first and second modes, said adjustment being determined after each repetition.

2. A method as claimed in claim 1, characterized in that said second signal comprises said first signal being suddenly suppressed at a predetermined instant, in the course of each repetition.

3. A method as claimed in claim 1, characterized in that said second signal comprises the phase of said first signal being suddenly inverted by 180°, at least once during each repetition.

4. A method as claimed in claim 1, characterized in that the signal produced by the frequency discriminator is sampled at two instants one of which corresponds to a rate fixed by the excitation at the nominal frequency and the other follows immediately after the change from the first to the second mode, and that the difference between the two samples produces the signal which determines the adjustment.

5. A method as claimed in claim 2, characterized in that the signal produced by the frequency discriminator is sampled at two instants one of which corresponds to a rate fixed by the excitation at the nominal frequency and the other follows immediately after the change from the first to the second mode, and that the difference between the two samples produces the signal which determines the adjustment.

6. A method as claimed in claim 3, characterized in that the signal produced by the frequency discriminator is sampled at two instants one of which corresponds to a rate fixed by the excitation at the nominal frequency and the other follows immediately after the change from the first to the second mode, and that the difference between the two samples produces the signal which determines the adjustment.

7. A device having an adjustable resonant circuit and at least one frequency discriminator coupled to an output of the adjustable resonant circuit, characterized in that said device comprises:
synchronizing means for determining a first instant and a second instant following rapidly after the first instant;
a generator coupled to said adjustable resonant circuit for supplying thereto a signal at a nominal frequency of said adjustable resonant circuit, said generator modifying said signal in response to a control signal applied thereto;
means for generating said control signal for said generator for a period of time commencing at said first instant and ending at said second instant;
means for sampling at said second instant a signal supplied by said frequency discriminator, and for shaping said signal;
means for forming an error signal which is a function of the amplitude of said sampled signal; and
means for adjusting said adjustable resonant circuit as a function of said error signal.

8. A device as claimed in claim 7, characterized in that said generator includes a stage which at two outputs supplies signals of opposite phases, and a change-over switch for changing, in response to said control signal, the output from which the signal is taken.

9. A device as claimed in claim 7, characterized in that the generator is constituted by an oscillator being phase-controlled by a feedback loop which is based on the line frequency in a video signal.

10. A device as claimed in claim 7, characterized in that the synchronizing means furthermore determine a third instant which corresponds to a fixed excitation rate at the nominal frequency, and in that it also comprises means for sampling the signal supplied by the discriminator at this third instant, and in that the means for forming the error signal comprises a comparator for taking the difference between the amplitude of the signal at the second instant and the amplitude of the signal at the third instant.

11. A device as claimed in claim 7, characterized in that said adjustable resonant circuit comprises a plurality of switched capacitors for selective insertion into said adjustable resonant circuit, and the means for adjusting the resonant circuit comprise means for controlling the switching of the capacitors, said controllers means being constituted by a memory whose content is either incremented or decremented at each sampling operation in accordance with the sign of the signal supplied by the discriminator, or is kept as it is when the absolute value of this signal is below a predetermined value, and in that, the content of the memory being expressed in binary notation, each of its bits controls the switching of one of the capacitors.

12. A device as claimed in claim 7, characterized in that the synchronizing means indicates said first instant once during each field retrace in a video signal.

13. A device as claimed in claim 8, characterized in that the synchronizing means furthermore determine a third instant which corresponds to a fixed excitation rate at the nominal frequency, and in that it also comprises means for sampling the signal supplied by the discriminator at this third instant, and in that the means for forming the error signal comprises a comparator for taking the difference between the amplitude of the signal at the second instant and the amplitude of the signal at the third instant.

14. A device as claimed in claim 9, characterized in that the synchronizing means furthermore determine a third instant which corresponds to a fixed excitation rate at the nominal frequency, and in that it also comprises means for sampling the signal supplied by the discriminator at this third instant, and in that the means for forming the error signal comprises a comparator for taking the difference between the amplitude of the signal at the second instant and the amplitude of the signal at the third instant.

15. A device as claimed in claim 8, characterized in that said adjustable resonant circuit comprises a plurality of switched capacitors for selective insertion into said adjustable resonant circuit, and the means for adjusting the resonant circuit comprise means for controlling the switching of the capacitors, said controlling means being constituted by a memory whose content is either incremented or decremented at each sampling operation in accordance with the sign of the signal supplied by the discriminator, or is kept as it is when the absolute value of this signal is below a predetermined value, and in that, the content of the memory being expressed in binary notation, each of its bits controls the switching of one of the capacitors.

16. A device as claimed in claim 9, characterized in that said adjustable resonant circuit comprises a plurality of switched capacitors for selective insertion into said adjustable resonant circuit, and the means for adjusting the resonant circuit comprise means for controlling the switching of the capacitors, said controlling means being constituted by a memory whose content is either incremented or decremented at each sampling operation in accordance with the sign of the signal supplied by the discriminator, or is kept as it is when the absolute value of this signal is below a predetermined value, and in that, the content of the memory being expressed in binary notation, each of its bits controls the switching of one of the capacitors.

17. A device as claimed in claim 10, characterized in that said adjustable resonant circuit comprises a plurality of switched capacitors for selective insertion into said adjustable resonant circuit, and the means for adjusting the resonant circuit comprise means for controlling the switching of the capacitors, said controlling means being constituted by a memory whose content is either incremented or decremented at each sampling operation in accordance with the sign of the signal supplied by the discriminator, or is kept as it is when the absolute value of this signal is below predetermined value, and in that, the content of the memory being expressed in binary notation, each of its bits controls the switching of one of the capacitors.

18. A device as claimed in claim 8, characterized in that the synchronizing means indicates said first instant once during each field retrace in a video signal.

19. A device as claimed in claim 9, characterized in that the synchronizing means indicates said first instant once during each field retrace in a video signal.

20. A device as claimed in claim 10, characterized in that the synchronizing means indicates said first instant once during each field retrace in a video signal.

21. A device as claimed in claim 11, characterized in that the synchronizing means indicates said first instant once during each field retrace in a video signal.

* * * * *